United States Patent [19]

Seidler

[11] 4,203,648
[45] May 20, 1980

[54] SOLDER BEARING TERMINAL

[75] Inventor: Jack Seidler, Flushing, N.Y.

[73] Assignee: North American Specialities Corp., Flushing, N.Y.

[21] Appl. No.: 935,151

[22] Filed: Aug. 23, 1978

Related U.S. Application Data

[63] Continuation-in-part of Ser. No. 824,441, Aug. 15, 1977, Pat. No. 4,120,558.

[51] Int. Cl.² ............................................. H01R 11/06
[52] U.S. Cl. ................................................ 339/275 T
[58] Field of Search ............... 339/17 L, 17 C, 275 R, 339/275 B, 275 T

[56] References Cited

U.S. PATENT DOCUMENTS

| | | | |
|---|---|---|---|
| 3,351,704 | 11/1967 | Setzler | 339/275 T |
| 4,019,803 | 4/1977 | Schell | 339/275 B |

FOREIGN PATENT DOCUMENTS 2321828  11/1973  Fed. Rep. of Germany ...... 339/17 LC

*Primary Examiner*—Joseph M. McGlynn
*Attorney, Agent, or Firm*—DeLio and Montgomery

[57] ABSTRACT

A terminal clip for attachment to a contact pad on a substrate having one or two individual masses of solder mechanically engaged with the clip in a position to be melted for bonding the clip to one or two surfaces of the contact pad.

9 Claims, 9 Drawing Figures

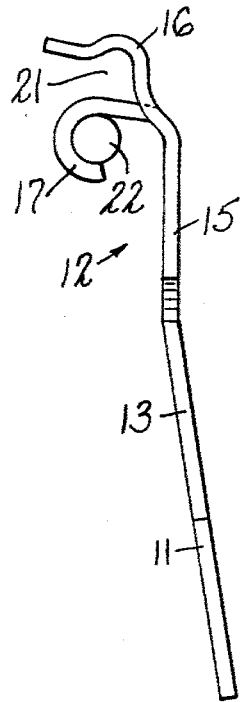
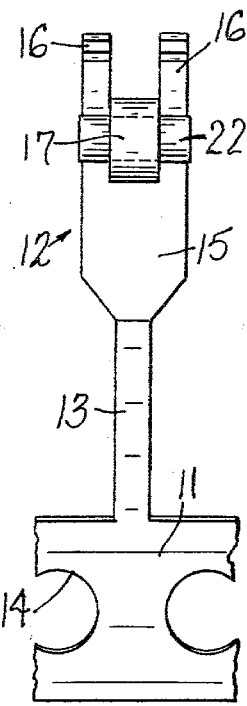
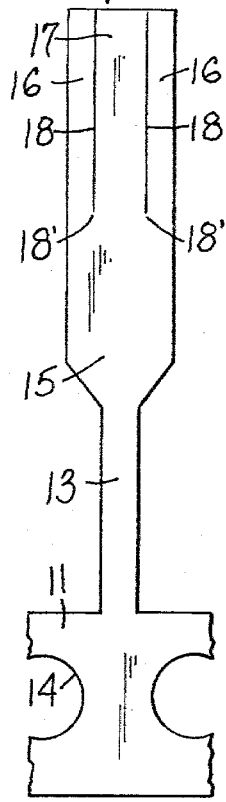
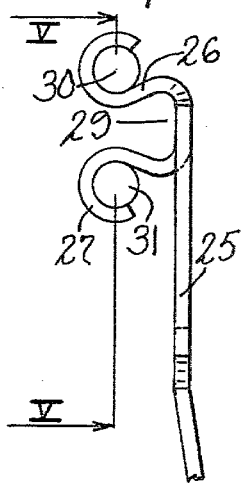
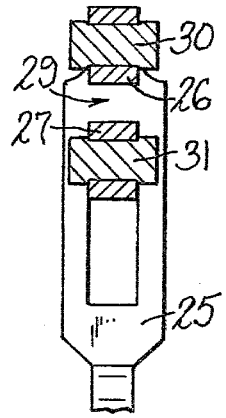
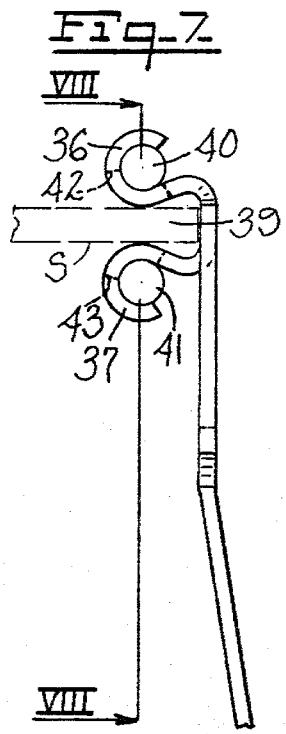
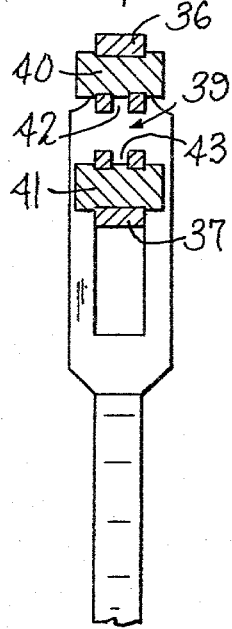
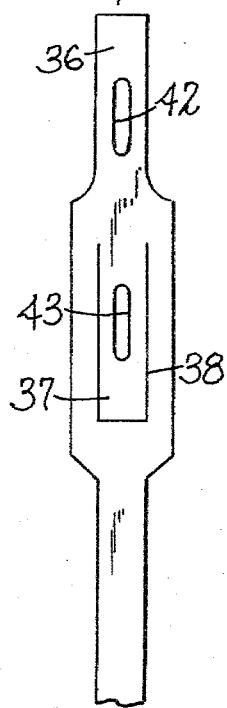
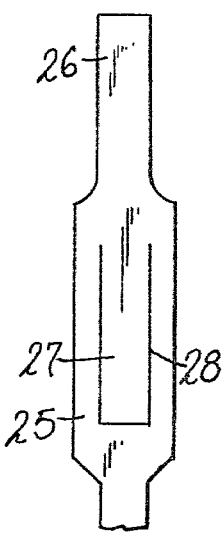

SOLDER BEARING TERMINAL

This application is a continuation-in-part of Ser. No. 824,441, filed Aug. 15, 1977, now Patent No. 4,120,558, issued Oct. 17, 1978.

This invention relates to a solder bearing terminal clip for attachment to a contact pad on a substrate wherein one or two solder plugs are mechanically engaged with the clip in positions to be melted for bonding the clip to the contact pad.

Various means have been provided wherein a quantity of solder is associated with a terminal clip so that when the clip has been positioned on a contact pad (usually a metal surface on a substrate introduced into the jaws of the clip) and the assembly is heated, the molten solder covers the adjacent surfaces of the clip and pad to form, when cool, a soldered metallurgical joint between the clip and pad. Clips of this general type are shown in Cox et al. U.S. Pat. No. 3,689,684 wherein the pads are pre-tinned; Landman U.S. Pat. No. 3,750,252 wherein a continuous solder wire extends along a strip of clips and is held by a bent back clip arm; and Schell U.S. Pat. No. 4,019,803 wherein an individual solder mass is soldered to a clip arm on the side opposite the contact surface with a solder globule extending across one or both edges of the arm to the adjacent contact surface.

It is an object of the present invention to provide means for attaching securely a solder mass to a terminal clip in a purely mechanical manner.

It is a further object of the invention to provide a solder bearing clip wherein each clip has its own supply of solder in two convenient locations for melting to form bonds with a pad.

It is another object of the invention to provide a solder and clip assembly which can be made by very simple and efficient stamping steps.

It is a still further object of the invention to provide certain improvements in the form, construction and arrangement of the parts whereby the above-named and other objects may effectively be attained.

The invention accordingly comprises an article of manufacture possessing the features, properties, and the relation of elements which will be exemplified in the article hereinafter described, and the scope of the invention will be indicated in the claims.

Practical embodiments of the invention are shown in the accompanying drawings wherein:

FIG. 1 represents a side view of a clip according to the invention;

FIG. 2 represents a front elevation of the clip shown in FIG. 1;

FIG. 3 represents a plan view of the blank as stamped to produce a clip according to FIGS. 1 and 2;

FIG. 4 represents a detail side view of the head of a first modified form of clip;

FIG. 5 represents a section on the line V—V of FIG. 4;

FIG. 6 represents a plan view of the blank as stamped to produce a clip according to FIGS. 4 and 5;

FIG. 7 represents a detail side view of the head of a second modified form of clip;

FIG. 8 represents a section on the line VIII—VIII in FIG. 7; and

FIG. 9 represents a detail plan view of the blank as stamped to produce the clip of FIGS. 7 and 8.

Referring to the drawings, and particularly to FIGS. 1 to 3, the solder terminal strip includes a continuous carrier strip 11 with individual terminal clips 12 connected thereto by stems 13. The carrier strip may be provided with pilot holes 14 at regular intervals, as is customary.

Each clip includes a flat body portion 15, a pair of spring fingers 16, bent to extend upwardly and laterally from the plane of the body portion distally of the clip and spaced apart by the width of a central spring finger 17 which extends laterally in a position spaced from and substantially parallel to the fingers 16, defining a gap 21 adapted to receive the edge of a substrate (not shown). The fingers 16 and 17 are formed from the blank shown in FIG. 4 by the parallel cuts 18 which extend from the free end and terminate at end points 18′. The free end of the finger 17 is curved arcuately away from the fingers 16, in a position to wrap around and grip securely, through more than 180°, the short cylindrical mass or slug of solder 22, as clearly shown in FIGS. 1 and 2.

The terminal clip just described, or an array of several such terminal clips, is applied to the edge of a substrate having one or several contact pads, with the finger 17 resting against the pad (the assembly being inverted) and heat is supplied to melt the solder, which flows around the finger 17 and bonds the clip securely to the substrate with a good electrical contact. The solder, in this clip, is held on the side of the gap nearer the body portion.

While clips of the type just described have been widely and successfully used, there may be situations where the solder from a single slug fails to form a strong and reliable bond. Provision is therefore made for using two solder plugs, one on each opposite surface of the substrate, as described below.

Referring to FIGS. 4 to 6, the first modified form of clip is shown as having a flat body portion 25, a single central spring finger 27 formed from the blank shown in FIG. 6 by the U-shaped cut 28, which has its ends directed toward the free end of the body portion and oppositely disposed additional spring finger 26, said latter finger being constituted by the free end of the body portion itself. The free ends of the fingers 26 and 27 are arcuately curved away from each other (and from the gap 29) in positions to wrap around and grip securely, through more than 180°, the cylindrical masses or slugs of solder 30 and 31. The application of such a clip to a contact pad on a substrate is effected in the same manner as described above, except that a soldered bond can be formed by each of the two solder slugs, on opposite surfaces of the substrate.

The second modified form of clip, shown in FIGS. 7 to 9, is basically the same as that shown in FIGS. 4 to 6, having a single central finger 37 formed from the main body 35 of the blank by a U-shaped cut 38 and an oppositely disposed additional finger 36. The fingers 36 and 37 are arcuately curved away from each other and wrapped, through more than 180°, around the cylindrical masses or slugs of solder 40 and 41. In this clip, however, each of the fingers 36 and 37 is provided with a narrow elongated slot 42 and 43, respectively, so located longitudinally of the fingers that the slotted portions of the fingers define the gap 39 into which the edge of a substrate S is to be introduced, as shown in FIG. 7. The narrow finger portions on each side of each slot bite into the softer metal of the solder plugs to give the fingers an extra strong grip on the slugs, and the slots provide additional access for the solder, when melted, to flow onto the substrate surface at and near the points of contact between the fingers and such surface. This multiplies the soldered area by including the walls of the slots as well as the substrate and finger surfaces, creating improved electrical conductivity as well as stronger binding.

While the slots are shown in connection with the double solder clips of FIGS. 7 to 9, advantages would also result from the provision of a slot in the single finger 17 of FIGS. 1 to 3, if desired, or either one of the slots 42 or 43 could be omitted. In FIGS. 1 to 3 the total width of the fingers 16 should equal or slightly exceed the width of the central finger 17, to substantially equalize the strength of the fingers on opposite sides of the gap 21.

In each of the clips described above, the solder slug, in the form of a cylindrical bar or wire is in firm mechanical engagement with the clip fingers or body, in a position to be melted for the formation of a bond between the fingers and terminal pad or the like. The solder slugs may, if desired, have a cross-section of square or other geometrical form, or be made from spherical pellets. Each clip also can be made by simple stamping and assembling steps, with minimal waste of material.

It will thus be seen that the objects set forth above, among those made apparent from the preceding description, are efficiently attained and, since certan changes may be made in the above article without departing from the spirit and scope of the invention, it is intended that all matter contained in the above description and shown in the accompanying drawing shall be interpreted as illustrative and not in a limiting sense.

What I claim is:

1. A terminal clip for securement to a contact pad on a substrate comprising an elongated clip body portion having a free end and a stem end, said body portion being cut longitudinally along two lines to define a central finger between spaced portions of the body portion, said finger being bent out of the plane of the body portion at approximately the point of attachment of said finger to the body portion, the free end of said body portion beyond said point of attachment constituting at least one additional finger and being bent out of the plane of the body portion in the same direction as the central finger, said central finger and additional finger defining a gap to receive the substrate, and a discrete mass of solder, the central finger being wrapped at least 180° around said mass of solder and indented into the surface of said mass for holding said mass of solder in a position adjacent said gap and on the side thereof nearer the stem end of the body portion.

2. A terminal clip for securement to a contact pad on a substrate comprising an elongated clip body portion having a free end and a stem end, said body portion being cut longitudinally along two lines to define a first finger between spaced portions of the body portion, said first finger being bent out of the plane of the body portion at approximately the point of attachment of said first finger to the body portion, the free end of said body portion beyond said point of attachment constituting at least one additional finger and being bent out of the plane of the body portion in the same direction as said first finger, said first finger and additional finger defining a gap to receive the substrate, and a discrete mass of solder, one of said fingers being wrapped at least 180° around said mass of solder and indented into the surface of said mass for holding said mass of solder in a position adjacent said gap and on the side thereof nearer the stem end of the body portion.

3. A terminal clip according to claim 1 or 2 wherein the body portion is cut on lines extending from its free end to form two additional fingers.

4. A terminal clip according to claim 1 or 2 wherein the central finger is provided with a slot extending between the mass of solder and the gap.

5. A terminal clip according to claim 1 or 2 wherein the cut in the body portion is substantially U-shaped with its ends directed toward the free end of the body portion and spaced therefrom, and wherein said free end constitutes the additional finger.

6. A terminal clip according to claim 5 which includes an additional mass of solder, the additional finger being wrapped at least 180° around said additional mass of solder and indented into the surface of said mass for holding said mass of solder in a position adjacent said gap and on the side thereof farther from the stem end of the body portion.

7. A terminal clip according to claim 6 wherein at least one finger is provided with a slot extending between the mass of solder and the gap.

8. A terminal clip according to claim 6 wherein each finger is provided with a slot extending between the respective mass of solder and the gap.

9. A terminal clip for securement to a contact pad on a substrate comprising a clip body portion, a plurality of contact fingers projecting from an end of the body portion and bent out of the plane of the body portion to define a gap adapted to receive the edge of a substrate, and a discrete mass of solder, said fingers including a pair of fingers spaced laterally apart and located distally of the clip and a central finger having a width corresponding substantially to the distance between said spaced fingers, said central finger including means wrapped at least 180° around said mass of solder and indented into the surface of the solder mas for holding said mass of solder in a position adjacent said gap and on the side thereof nearer the clip body portion.

* * * * *